(12) United States Patent
Lippy et al.

(10) Patent No.: US 11,346,008 B2
(45) Date of Patent: May 31, 2022

(54) RUTHENIUM ETCHING COMPOSITION AND METHOD

(71) Applicant: ENTEGRIS, INC., Billerica, MA (US)

(72) Inventors: Steven Lippy, Brookfield, CT (US); Emanuel I. Cooper, Scarsdale, NY (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 16/692,834

(22) Filed: Nov. 22, 2019

(65) Prior Publication Data

US 2020/0190673 A1 Jun. 18, 2020

Related U.S. Application Data

(60) Provisional application No. 62/779,643, filed on Dec. 14, 2018.

(51) Int. Cl.
| | |
|---|---|
| C23F 1/40 | (2006.01) |
| C23F 1/30 | (2006.01) |
| C23F 1/38 | (2006.01) |
| C23F 1/34 | (2006.01) |
| C09K 13/04 | (2006.01) |
| C09K 13/02 | (2006.01) |

(52) U.S. Cl.
CPC .............. *C23F 1/40* (2013.01); *C09K 13/04* (2013.01); *C23F 1/30* (2013.01); *C23F 1/34* (2013.01); *C23F 1/38* (2013.01); *C09K 13/02* (2013.01)

(58) Field of Classification Search
CPC ...... C23F 1/30; C23F 1/34; C23F 1/38; C23F 1/40; C09K 13/02; C09K 13/04
See application file for complete search history.

(56) References Cited

U.S. PATENT DOCUMENTS

| | | | |
|---|---|---|---|
| 2006/0226122 A1 | 10/2006 | Wojtczak | |
| 2009/0124082 A1* | 5/2009 | Park ..................... | C09G 1/02 438/693 |
| 2012/0256122 A1 | 10/2012 | Sato | |

(Continued)

FOREIGN PATENT DOCUMENTS

| | | | |
|---|---|---|---|
| JP | 2001240985 A | | 9/2001 |
| JP | 2002016053 A | * | 1/2002 |

(Continued)

OTHER PUBLICATIONS

English machine translation of TW 2020 24396 A, Kashiwagi et al, "Composition for removing ruthenium" published Jul. 1, 2020. (Year: 2020).*

(Continued)

*Primary Examiner* — Anita K Alanko
(74) *Attorney, Agent, or Firm* — Entegris, Inc.

(57) ABSTRACT

The invention provides compositions useful for selectively etching ruthenium and/or copper. The compositions comprise certain periodate compounds, alkylammonium or alkylphosphonium hydroxides, carbonate or bicarbonate buffers, and water, wherein the pH of the composition is about 9 to about 12.5. The compositions of the invention are effectively utilized in the method of the invention and have been found to be capable of etching Cu and Ru at similar rates, i.e., >20 Å/min, while minimizing etch rates of dielectrics (<2 Å/min).

17 Claims, 1 Drawing Sheet

(56) References Cited

U.S. PATENT DOCUMENTS

| | | | |
|---|---|---|---|
| 2014/0038398 A1* | 2/2014 | Heo | H01L 21/02071 438/585 |
| 2015/0087156 A1 | 3/2015 | Kamimura | |
| 2016/0130500 A1* | 5/2016 | Chen | C09K 13/02 216/13 |
| 2019/0148634 A1* | 5/2019 | Park | H01L 21/3065 438/3 |
| 2020/0347299 A1* | 11/2020 | Takahashi | H01L 21/02068 |
| 2021/0155851 A1* | 5/2021 | Ohhashi | C09K 13/04 |

FOREIGN PATENT DOCUMENTS

| | | | |
|---|---|---|---|
| JP | 2006173454 A * | 6/2006 | |
| WO | WO-2020100924 A1 * | 5/2020 | C11D 7/08 |

OTHER PUBLICATIONS

JP 2018-214179 (Nov. 14, 2019) (priority document for WO 2020/100924 A1) (Year: 2019).*

Partial English translation of WO 2020/100924 A1, Kashiwagi et al "Composition for Removing Ruthenium" published 22.05.2020. (Year: 2020).*

Kim, In-Kwon et al.; "Effect of pH in Ru Slurry with Sodium Periodate on Ru CMP"; Journal of Electrochemical Society, 156 (3) H188-H192; 2009.

Peethala, B.C. et al; "Ruthenium Polishing Using Potassium Periodate as the Oxidizer and Silica Abrasives"; Journal of the Electrochemical Society, 128(3), H271-H276; 2011.

Hsu, Chien-Pin Sherman et al; "Versatile Aqueous Chemistry for Selective Ru or WNx Etch and Implant BARC Removal in 5- and 3-nm Applications"; Solid State Phenomena, 1662-9787, vol. 282, pp. 288-292; Jul. 10, 2018.

* cited by examiner

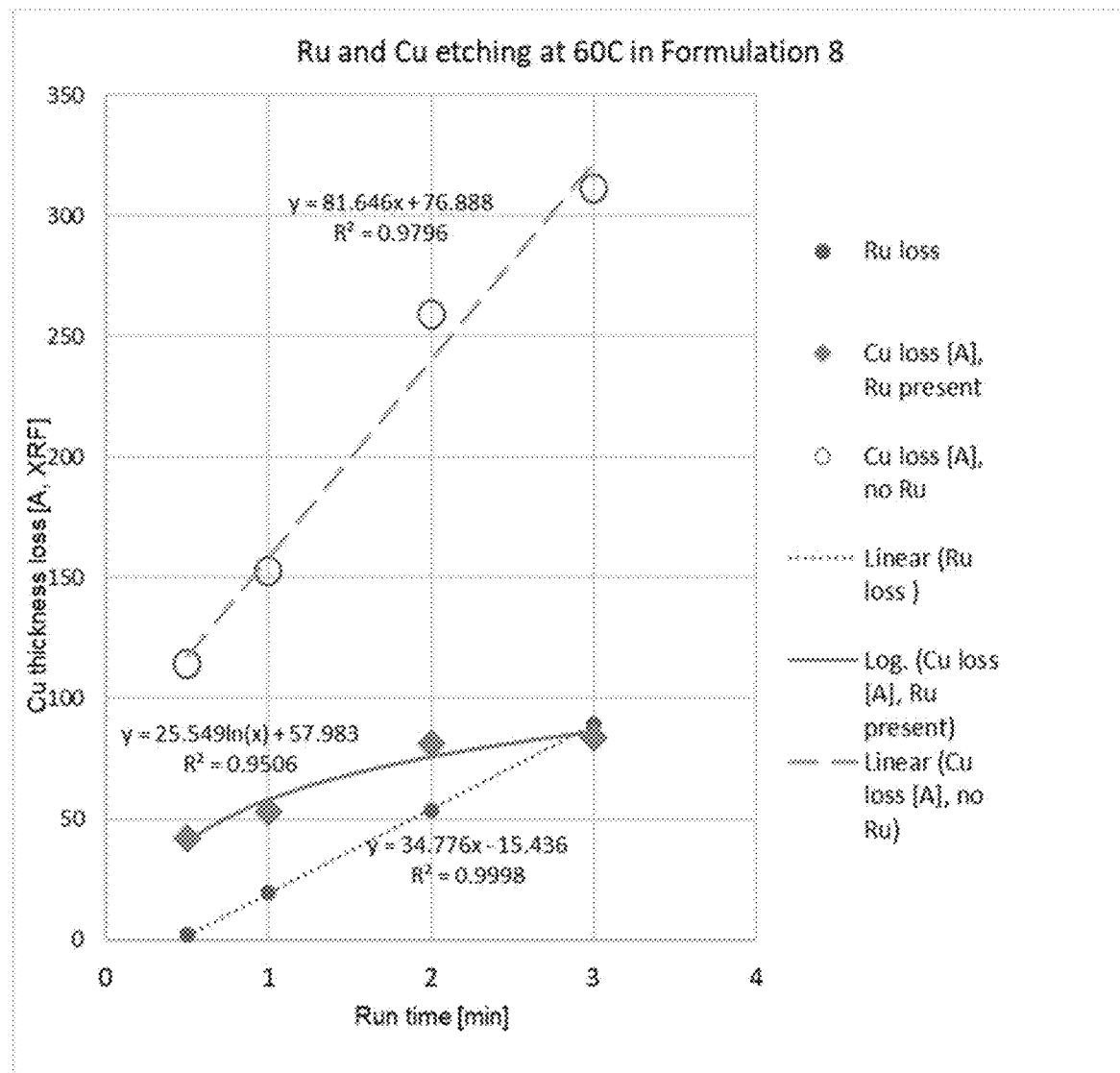

RUTHENIUM ETCHING COMPOSITION AND METHOD

FIELD OF THE INVENTION

This invention belongs to the field of electronic chemicals. In particular, it relates to a composition and method for selectively etching ruthenium and/or copper.

BACKGROUND OF THE INVENTION

In dynamic random access (DRAM) memory devices, metal-insulator-metal (MIM) capacitors possess a bottom electrode manufactured using Noble metals such as ruthenium. Given its electrical performance, ruthenium has also been found to serve as a copper diffusion barrier material for copper interconnections.

Isolation and planarization of ruthenium is problematic though as it is generally self-coated with a hard-to-etch $RuO_2$ oxide film. Its etching requires strong oxidants, which however tend to convert Ru and $RuO_2$ into the volatile and toxic oxide $RuO_4$. The $RuO_4$ vapor so formed reacts with organic materials and generates $RuO_2$ particles. These characteristics limit the range of pH in which ruthenium can be etched safely to >9, and preferably to >10, in order to form only non-volatile oxyanions of ruthenium.

SUMMARY OF THE INVENTION

The invention is as set forth in the appended claims. In a first aspect, the invention provides a composition comprising
(i) one or more heptavalent iodine oxoacids chosen from orthoperiodic acid ($H_5IO_6$) or metaperiodic acid($HIO_4$) or salts thereof;
(ii) an alkylammonium hydroxide compound or an alkylphosphonium hydroxide compound; and
(iii) water;
wherein said composition has a pH of about 9 to about 12.5. In the compositions of the invention, periodic acid is utilized as an oxidant. Periodic acid exists in two main forms, orthoperiodic acid ($H_5IO_6$) and metaperiodic acid ($HIO_4$) and both forms are contemplated for use as component (i) above. Also, other encountered oxoacids can include $H_3IO_5$, $H_4I_2O_9$, and $H_7I_3O_{14}$ or salts thereof. Orthoperiodic acid was utilized in the Examples below. In another embodiment, the composition further comprises (iv) a carbonate/bicarbonate buffering compound. The compositions of the invention are effectively utilized in the method of the invention and have been found to be capable of etching Cu and Ru at similar rates, i.e., >20 Å/min, while minimizing etch rates of dielectrics (<2 Å/min).

BRIEF SUMMARY OF THE DRAWINGS

FIG. 1 is a plot of Cu thickness loss in angstroms as determined by XRF (x-ray fluorescence versus run time in minutes. The composition tested was 2.108% periodic acid ($H_5IO_6$) 3.494% tetramethylammonium hydroxide, and 0.475% $CO_2$ (Formulation Example 8 below.)

DETAILED DESCRIPTION OF THE INVENTION

As used herein, "microelectronic device" corresponds to semiconductor substrates, including DRAM 3D NAND structures, flat panel displays, and microelectromechanical systems (MEMS), manufactured for use in microelectronic, integrated circuit, or computer chip applications. It is to be understood that the term "microelectronic device" is not meant to be limiting in any way and includes any substrate that includes a negative channel metal oxide semiconductor (nMOS) and/or a positive channel metal oxide semiconductor (pMOS) transistor and will eventually become a microelectronic device or microelectronic assembly.

As used herein, "about" is intended to correspond to +/−5% of the stated value.

Compositions of the invention may be embodied in a wide variety of specific formulations, as hereinafter more fully described.

In certain embodiments of the composition, component (i) is present in an amount of about 0.01 to 20 percent by weight; component (ii) is present in an amount of about 0.02 to 40 percent by weight; with the total of (i), (ii) component (iii) being 100 percent.

In certain embodiments of the composition, component (i) is present in an amount of about 0.5 to 10 percent by weight; and component (ii) is present in an amount of about 1 to 20 percent by weight; with the total of (i), (ii) component (iii) being 100 percent.

In certain embodiments of the composition, component (i) is present in an amount of about 1 to 5 percent by weight and component (ii) is present in an amount of about 2 to 10 percent by weight; with the total of (i), (ii) component (iii) being 100 percent.

In certain embodiments, the composition further comprises
(iv) a carbonate/bicarbonate buffering compound in an amount of about 0.01 to 5 weight percent, 0.1 to 2 weight percent, or 0.2 to 1 weight percent, with the total of (i), (ii), (iii), and (iv) being 100 percent.

As used in the specification and the appended claims, the singular forms "a," "an" and "the" include their plural referents unless the context clearly dictates otherwise. The terms "containing" or "including" are intended to be synonymous with the term "comprising", meaning that at least the named compound, element, particle, or method step, etc., is present in the composition or article or method, but does not exclude the presence of other compounds, materials, particles, method steps, etc., even if the other such compounds, material, particles, method steps, etc., have the same function as what is named, unless expressly excluded in the claims.

In the compositions of the invention, an alkylammonium (or alkylphosphonium) periodate species is typically formed in situ while using an excess of alkylammonium hydroxide or alkylphosphonium hydroxide in conjunction with the periodic acid (component (i)), as the pH is adjusted to the desired level. Alternatively, in another embodiment of the invention, a periodate salt can be added, either in pure form or as a solution made of a periodic acid, water and a base such as an alkylammonium hydroxide in order to adjust the pH to a desired level. Conveniently, a carbonate/bicarbonate buffer system can be utilized to stabilize the aqueous composition while sparging the solution with CO2; alternately, once could add water containing dissolved $CO_2$ at a desired concentration. The use of a carbonate buffer advantageously avoids potential incompatibilities with (oxidizable) amine buffers. Alternately, one could utilize the carbonate and/or bicarbonate salt of an alkylammonium hydroxide or alkylphosphonium hydroxide and add such species to the composition as a solid or liquid. The alkylphosphonium hydroxide compound can have the formula HxN(P)Ry, with x+y=4, wherein y>0.

In one embodiment, the composition comprises (as starting material ingredients) about 93.923% water, 3.494% tetramethylammonium hydroxide, 2.108% $H_5IO_6$, 0.475% $CO_2$, and possesses a pH of about ~10.8. In another embodiment, the composition is comprised of approximately 94 weight percent water, 3.5 weight percent tetramethylammonium hydroxide, and about 0.5 weight percent of the carbonate/bicarbonate buffering compound.

We have found that such compositions are sufficiently basic to avoid formation of the toxic and volatile $RuO_4$ vapor and also tend to dissolve Cu as its $Cu^{3+}$ soluble complex with periodate, while still sufficiently active to oxidize ruthenium at >20 Å/min (Ru etch rate decreases with increasing pH). In the practice of the process of the invention, one may choose to vary the etch rate between Ru and Cu by varying the pH within the range recited above, with Ru being preferentially etched at lower pH, approaching 9, and with Cu being preferentially etched at higher pH, approaching 11. Moreover, we have found that the pH of the compositions is low enough that PETEOS etch rate is <1 Å/min, and OSG etch rate, is quite low (~6 Å/min).

In etching applications, the composition is applied in any suitable manner to the surface of the microelectronic device having the ruthenium and/or copper materials thereon, e.g., by spraying the composition on the surface of the device, by dipping (in a static or dynamic volume of the removal composition) of the device including the ruthenium and copper. In one embodiment, the application of the removal composition to the surface of the microelectronic device is controlled agitation whereby the composition is circulated through the container housing said composition.

As defined herein, the term "barrier material" corresponds to any material used in the art to seal the metal lines (e.g., copper interconnects) to minimize the diffusion of said metal (e.g., copper) into the dielectric material. Preferred barrier layer materials include tantalum, titanium, ruthenium, hafnium, tungsten, and other refractory metals and their nitrides and silicides.

In use of the compositions of the invention for removing ruthenium and/or copper material from microelectronic device structures having same thereon, the composition typically is contacted with the microelectronic device structure for a sufficient time of from about 1 minute to about 200 minutes, in one embodiment, about 15 minutes to about 100 minutes, or about 1 minute to about 2 minutes for a single wafer tool, at sufficient conditions including, but not limited to, in one embodiment, a temperature in a range of from about 20° C. to about 90° C. in the case for batch etching, or in another embodiment, about 50° C. to about 90° C. for single wafer tool etching. Such contacting times and temperatures are illustrative, and any other suitable time and temperature conditions may be employed that are efficacious to at least partially remove the ruthenium and/or copper material from the device structure, within the practice of the invention.

In order to achieve a pH of about 9 to about 12.5, component (ii) of the composition is added in excess and can be an alkylammonium hydroxide compound having the formula $NR_4R_5R_6R_7OH$, wherein $R_4$, $R_5$, $R_6$ and $R_7$ may be the same as or different from one another and are chosen from hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxymethyl, hydroxyethyl, hydroxypropyl, hydroxybutyl, hydroxypentyl, and hydroxyhexyl) groups, and substituted or unsubstituted $C_6$-$C_{10}$ aryl groups (e.g., benzyl groups). Alkylammonium hydroxides that are commercially available include tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, and combinations thereof, may be used. Alternatively or in addition, component (ii) of the composition may be a phosphonium base having the formula $(PR_8R_9R_{10}R_{11})OH$, wherein $R_8$, $R_9$, $R_{10}$, and $R_{11}$ may be the same as or different from one another and are selected from the group consisting of hydrogen, straight-chain $C_1$-$C_6$ alkyl (e.g., methyl, ethyl, propyl, butyl, pentyl, and hexyl) groups, branched $C_1$-$C_6$ alkyl groups, $C_1$-$C_6$ hydroxyalkyl (e.g., hydroxymethyl, hydroxyethyl, hydroxypropyl, hydroxybutyl, hydroxypentyl, and hydroxyhexyl) groups, substituted $C_6$-$C_{10}$ aryl groups, unsubstituted $C_6$-$C_{10}$ aryl groups (e.g., benzyl groups), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, n-propyl triphenylphosphonium hydroxide.

In a further embodiment, the compositions of the invention further comprise one or more corrosion inhibitors. Such corrosion inhibitors in the context of the present invention decrease the corrosion rate of a metal; classes of corrosion inhibitors may include but are not limited to: 1. molecules that bind, adsorb, coat or react to/with the metal surface and provide a barrier for the transport of oxygen or water to the metal surface or prevent the transmission of oxidized metal cations out of the surface; 2. molecules that change the electrochemical surface potential of a metal and make it more noble; and 3. molecules that sacrificially scavenge oxygen or acids that increase corrosion rate. Exemplary corrosion inhibitors include compounds such as triazoles and derivatives thereof, benzotriazoles and derivatives thereof, tolyltriazole, thiazoles and derivatives thereof, tetrazoles and derivatives thereof, imidazoles and derivatives thereof, and azines and derivatives thereof. Exemplary corrosion inhibitors include 5-aminotetrazole, 5-phenyl-benzotriazole, 1H-tetrazole-5-acetic acid, 1-phenyl-2-tetrazoline-5-thione, benzimidazole, methyltetrazole, Bismuthiol I, cytosine, guanine, thymine, pyrazoles, iminodiacetic acid (IDA), propanethiol, benzohydroxamic acids, citric acid, ascorbic acid, 5-amino-1,3,4-thiadiazole-2-thiol (ATDT), benzotriazole (BTA), 1,2,4-triazole (TAZ), tolyltriazole, 5-methyl-benzotriazole (mBTA), 5-phenyl-benzotriazole, 5-nitro-benzotriazole, benzotriazole carboxylic acid, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole (3-ATA), 3-mercapto-1,2,4-triazole, 3-isopropyl-1,2,4-triazole, 5-phenylthiol-benzotriazole, halo-benzotriazoles (halo=F, Cl, Br or I), naphthotriazole, 2-mercaptobenzimidazole (MBI), 2-mercaptobenzothiazole, 4-methyl-2-phenylimidazole, 2-mercaptothiazoline, 5-amino-1,2,4-triazole (5-ATA), sodium dodecyl sulfate (SDS), ATA-SDS, 3-amino-5-mercapto-1,2,4-triazole, pentylenetetrazole, 5-phenyl-1H-tetrazole, 5-benzyl-1H-tetrazole, Ablumine O, 2-benzylpyridine, succinimide, 2,4-diamino-6-methyl-1,3,5-triazine, thiazole, triazine, methyltetrazole, 1,3-dimethyl-2-imidazolidinone, 1,5-pentamethylenetetrazole, 1-phenyl-5-mercaptotetrazole, diaminomethyltriazine, imidazoline thione, 4-methyl-4H-1, 2,4-triazole-3-thiol, 4-amino-4H-1,2,4-triazole, 3-amino-5-methylthio-1H-1,2,4-triazole, benzothiazole, imidazole, indiazole, adenine, succinimide, adenosine, carbazole, saccharin, uric acid, benzoinoxime, cationic quaternary salts (e.g., benzalkonium chloride, benzyldimethyldodecylammonium chloride, myristyltrime thylammonium bromide, dodecyltrimethylammonium bromide, hexadecylpyridinium chloride, Aliquot 336 (Cognis), benzyldimethylphenylammonium chloride, Crodaquat TES (Croda. Inc.), Rewoquat CPEM (Witco), hexadecyltrimethylammonium p-toluenesulfonate, hexadecyltrimethylammonium hydroxide, 1-methyl-1'-tetradecyl-4,4'-bipyridium dichloride, alkyltrimethylammonium bromide, amprolium hydrochloride, benzethonium hydroxide, benzethonium chloride, benzyldinethylhexadecylammonium chloride, benzyldimethyltetradecylammonium chloride, benzyldodecyldimethylammonium bromide, benzyldodecyldimethylammonium chloride, cetylpyridinium chloride, choline p-toluenesulfonate salt, dimethyldioctadecylammonium bromide, dodecylethyldime thylammonium bromide, dodecyltrimethylammonium chloride, ethylhexadecyldimethylammonium bromide, Girard's reagent, hexadecyl(2-hydroxyethyl)dimethylammonium dihydrogen phosphate, hexadecylpyridinium bromide, hexadecyltrimethylammonium bromide, hexadecyltrimethylammonium chloride, methylbenzethonium chloride, Hyamine® 1622, Luviquat™, N,N',N'-polyoxyethylene (10)-N-tallow-1,3-diaminopropane liquid, oxyphenonium bromide, tetraheptylammonium bromide, tetrakis(decyl)ammonium bromide, thonzonium bromide, tridodecylammonium chloride, trimethyloctadecylammonium bromide, 1-methyl-3-n-octylimidazolium tetrafluoroborate, 1-decyl-3-methylimidazolium tetrafluoroborate. 1-decyl-3-methylimidazolium chloride, tridodecylmethylammonium bromide, dimethyldistearylammonium chloride, cetyltrimethylammonium bromide, myristyltrimethylammonium bromide, and hexamethonium chloride), anionic surfactants (e.g., dodecylbenzenesulfonic acid, sodium dodecylbenzenesulfonate, dodecylphosphonic acid (DDPA), stearoyl sarcosine, laurylsarcosine, Surfynol® 104 (tetramethyl decynediol, Evonik), propargyl alcohol, dicyandiamide, dimethylpropargyl alcohol, saccharine diethylhydroxylamine, hydroxylamine, 2-mercapto-2-thiazoline, mercaptothiadiazole aminomercaptothiadiazole, dimercaptothiadiazole, 3-methylpyrazoline-5-one and combinations thereof.

Following the achievement of the desired removal action, the etchant composition is readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$ vapor-dry, etc.). Accordingly, in a further embodiment, the invention provides a method for removing ruthenium and/or copper from a microelectronic device, which comprises contacting the electronic device with the compositions as set forth herein, for a sufficient time under sufficient conditions to at least partially remove said ruthenium and/or copper from the microelectronic device.

A still further aspect of the invention relates to methods of manufacturing an article comprising a microelectronic device, said method comprising contacting the microelectronic device with the compositions of the present invention for sufficient time to etchingly remove ruthenium and/or copper material from the surface of the microelectronic device having same thereon, and incorporating said microelectronic device into said article.

The compositions described herein are easily formulated by simple addition of the respective ingredients and mixing to homogeneous condition.

The invention has been described in detail with particular reference to embodiments thereof, but it will be understood that variations and modifications can be effected within the spirit and scope of the invention.

EXAMPLES

The formulations tabulated below were prepared by adding a 50% orthoperiodic acid solution into the calculated amount of water, then adding the specified amount of a 20-25% solution of the particular base (>2 moles base per mole of periodic acid) with stirring and cooling. For $CO_2$-containing solutions (#6-8), a tetramethylammonium carbonate-bicarbonate buffer was prepared by slowly bubbling $CO_2$ through a 25% TMAH solution until the pH decreased to about 11.5, after which a calculated amount of the buffer was added to a mixture of water, periodic acid and TMAH.

Etching of blanket film coupons was performed at 60° C. with stirring. No pretreatment of ruthenium was attempted; copper pretreatment with 5% acetic acid (HAc) was shown to increase etch rate but only slightly. The tabulated Cu results were obtained without HAc pretreatment, while the results plotted further below were obtained with HAc—pretreated copper. Etched coupons were rinsed with deionized water and dried in a nitrogen jet. Metal thickness changes were determined by XRF; dielectric thickness changes—by ellipsometry.

While the KOH-based formulations etched much faster than the alkylammonium-based ones, they are harsher on the dielectric components.

| | | | Etch rates at 60° C., in Å/min | | | | | | | | | | | | |
|---|---|---|---|---|---|---|---|---|---|---|---|---|---|---|---|
| | | | Film | | | | | | | | | | | | |
| | Comp. | | Ru | | | | | Cu | | | PETEOS | | OSG | | TaN |
| | | | | | | | | run length | | | | | | | |
| Form. | (mol/kg) | pH | 0.5' | 1' | 3' | 5' | 10' | 1' | 3' | 20' | 10' | 20' | 3' 10' | 20' | 10' 20' |
| 1 | 0.2 PIA + 0.44 KOH | 11.75 12.13 | >450* | >225 | | | | | | (>176) | 9.9 (high)** | | ? (high)* | | <1 |
| 3 | 0.2 PIA + 0.44 MTEAH | 11.97 | | | | | 7.3 | | | | | | | | |
| 4 | 0.2 PIA + 0.44 TMAH | 12.22 | | | | | 6.85 | | | | | | | | |

-continued

| | | | Etch rates at 60° C., in Å/min Film | | | | | | | | | | | | | |
|---|---|---|---|---|---|---|---|---|---|---|---|---|---|---|---|---|---|
| | | | Ru | | | | | Cu | | | PETEOS | | OSG | | | TaN | |
| | Comp. | | | | | | | | | run length | | | | | | | |
| Form. | (mol/kg) | pH | 0.5' | 1' | 3' | 5' | 10' | 1' | 3' | 20' | 10' | 20' | 3' | 10' | 20' | 10' | 20' |
| 5 | 0.2 PIA + 0.4025 TMAH | 11.37 | | | | | | 66 | | | 0.55 | | | 4.8 | | | |
| 6 | 0.2 PIA + 0.66 TMAH + 0.13 CO$_2$ | 12.2 | | 13.2 | | 15.4 | | 97.4 | | | | | | | | | |
| 7 | 0.2 PIA + 0.705 TMAH + 0.177 CO$_2$ | 10.51 | >223 | | (>45) | | | 153.7 | | | 0.82 | | | 6.6 | | 0.07 | |
| 8 | .0925 PIA 0.3834 TMAH 0.1079 CO$_2$ 2.108% PIA, 3.494% TMAH, 0.475% CO$_2$ | 10.79 | 4 | 20 | 30 | | | 53 | 28 | | | 0.3 | 6.1 | 7.4 | | −0.17 | 0.09 |

*In cases where the film was completely etched away, the result - preceded by ">" – is a lower limit.
**OSG was severely roughened in this case, so the thickness could not be measured accurately.

Legend for Abbreviations:
PIA = periodic acid, H$_5$IO$_6$.
MTEAH = methyltriethylammonium hydroxide
PETEOS = plasma enhanced tetraethylorthosilicate
OSG = organosilicate glass

The invention claimed is:

1. A method for removing ruthenium and/or copper from a microelectronic device comprising ruthenium and/or copper and further comprising dielectrics, which comprises:
   i) contacting the electronic device with a composition for a sufficient time under sufficient conditions to at least partially remove said ruthenium and/or copper from the microelectronic device, the composition comprising
      (i) one or more heptavalent oxidants chosen from H$_5$IO$_6$ or HIO$_4$,
      (ii) an alkylphosphonium hydroxide compound; and
      (iii) water,
   wherein said composition has a pH of about 9 to about 12.5, and
   ii) etching the ruthenium and/or copper at an etch rate of greater than 20 Å/min while minimizing the etching of the dielectrics to an etch rate of less than 2 Å/min.

2. The method of claim 1, wherein the alkylphosphonium hydroxide compound is chosen from tetrabutylphosphonium hydroxide, tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, and n- propyl triphenylphosphonium hydroxide, and combinations thereof.

3. The method of claim 1, further comprising
   (iv) a carbonate/bicarbonate buffering compound.

4. The method of claim 3, wherein the buffering compound is formed in situ by sparging the composition with carbon dioxide.

5. The method of claim 1, wherein component (i) is present in an amount of about 0.01 to 20 percent by weight; component (ii) is present in an amount of about 0.02 to 40 percent by weight; with the total of (i), (ii) component (iii) being 100 percent.

6. The method of claim 1, wherein component (i) is present in an amount of about 0.5 to 10 percent by weight; component (ii) is present in an amount of about 1 to 20 percent by weight; with the total of (i), (ii) component (iii) being 100 percent.

7. The method of claim 1, wherein component (i) is present in an amount of about 1 to 5 percent by weight; component (ii) is present in an amount of about 2 to 10 percent by weight; with the total of (i), (ii) component (iii) being 100 percent.

8. The method of claim 5, further comprising
   (iv) a carbonate/bicarbonate buffering compound in an amount of about 0.01 to 5 weight percent, with the total of (i), (ii), (iii), and (iv) being 100 percent.

9. The method of claim 6, further comprising
   (iv) a carbonate/bicarbonate buffering compound in an amount of about 0.1 to 2 weight percent, with the total of (i), (ii), (iii), and (iv) being 100 percent.

10. The method of claim 7, further comprising
    (iv) a carbonate/bicarbonate buffering compound in an amount of about 0.2 to 1 weight percent, with the total of (i), (ii), (iii), and (iv) being 100 percent.

11. The method of claim 1, wherein the oxidant is HIO$_4$.
12. The method of claim 1, wherein the oxidant is HIO$_4$.
13. The method of claim 1, further comprising at least one corrosion inhibitor.
14. A method for removing ruthenium and/or copper from a microelectronic device comprising ruthenium and/or copper and further comprising dielectrics, which comprises:

i) contacting the electronic device with a composition for a sufficient time under sufficient conditions to at least partially remove said ruthenium and/or copper from the microelectronic device, the composition comprising
  (i) one or more heptavalent oxidants chosen from $H_5IO_6$ or $HIO_4$,
  (ii) an alkylammonium hydroxide compound, and
  (iii) water,
wherein said composition has a pH of about 10.5 to about 12.2 and wherein said composition has an excess of (ii) relative to (i) and
  ii) etching ruthenium and/or copper at an etch rate of greater than 20 Å/min while minimizing the etching of dielectrics to an etch rate of less than 2 Å/min.

15. The method of claim 14, wherein the alkylammonium compound is chosen from tetramethylammonium hydroxide, tetraethylammonium hydroxide, tetrapropylammonium hydroxide, tetrabutylammonium hydroxide, tributylmethylammonium hydroxide, benzyltrimethylammonium hydroxide, choline hydroxide, ethyltrimethylammonium hydroxide, tris(2-hydroxyethyl)methyl ammonium hydroxide, diethyldimethylammonium hydroxide, and combinations thereof.

16. The method of claim 15, wherein the alkylammonium compound is tetramethylammonium hydroxide.

17. The method of claim 14, further comprising
  (iv) a carbonate/bicarbonate buffering compound.

* * * * *